(12) United States Patent
Jo et al.

(10) Patent No.: US 12,143,101 B2
(45) Date of Patent: Nov. 12, 2024

(54) RADIO FREQUENCY SWITCH

(71) Applicant: SAMSUNG ELECTRO-MECHANICS CO., LTD., Suwon-si (KR)

(72) Inventors: Byeonghak Jo, Suwon-si (KR); Wonsun Hwang, Suwon-si (KR); Shinhaeng Heo, Suwon-si (KR); Dongil Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 8 days.

(21) Appl. No.: 18/181,165

(22) Filed: Mar. 9, 2023

(65) Prior Publication Data

US 2023/0318597 A1    Oct. 5, 2023

(30) Foreign Application Priority Data

Nov. 30, 2022  (KR) .................. 10-2022-0164438

(51) Int. Cl.
*H03K 17/68* (2006.01)
*H03K 17/06* (2006.01)
*H03K 17/10* (2006.01)
*H03K 17/687* (2006.01)

(52) U.S. Cl.
CPC ....... *H03K 17/6871* (2013.01); *H03K 17/063* (2013.01); *H03K 17/102* (2013.01)

(58) Field of Classification Search
None
See application file for complete search history.

(56) References Cited

U.S. PATENT DOCUMENTS

| | | | | |
|---|---|---|---|---|
| 5,821,769 A | * | 10/1998 | Douseki | H03K 19/0016 326/121 |
| 6,677,803 B1 | * | 1/2004 | Chiba | H03K 19/0013 327/534 |
| 9,406,695 B2 | * | 8/2016 | Shapiro | H01L 27/0288 |
| 9,628,075 B2 | * | 4/2017 | Cebi | H01L 27/1203 |
| 9,800,285 B2 | * | 10/2017 | Li | H04B 1/40 |
| 9,941,347 B2 | * | 4/2018 | Shapiro | H01L 28/20 |
| 10,263,616 B1 | | 4/2019 | Scott et al. | |
| 10,659,031 B2 | | 5/2020 | Franck et al. | |
| 10,790,815 B2 | | 9/2020 | Brindle et al. | |
| 10,931,193 B2 | * | 2/2021 | Tokuda | H03K 17/06 |

* cited by examiner

*Primary Examiner* — Jeffrey S Zweizig
(74) *Attorney, Agent, or Firm* — NSIP Law

(57) ABSTRACT

A radio frequency (RF) switch includes a switch transistor, and a bias transistor having a body terminal and a first terminal connected to each other, a diode-connected configuration, and configured to provide a first current to a body terminal of the switch transistor corresponding to a voltage applied to a control terminal of the switch transistor.

27 Claims, 17 Drawing Sheets

RADIO FREQUENCY SWITCH

CROSS-REFERENCE TO RELATED APPLICATIONS

This application claims the benefit under 35 USC 119(a) of Korean Patent Application No. 10-2022-0040919 filed in the Korean Intellectual Property Office on Apr. 1, 2022, and Korean Patent Application No. 10-2022-0164438 filed in the Korean Intellectual Property Office on Nov. 30, 2022, the entire disclosures of which are incorporated herein by reference for all purposes.

BACKGROUND

1. Field

The present disclosure relates to an RF switch.

2. Description of the Background

As the 5G system is disseminated in the radio frequency (RF) communication system, technics of many generations (e.g., 2G, 3G, LTE, and 5G) may be integrated into the mobile phone system. By this, a plurality of front end modules (FEM) may share a limited number of antennas, and FEM configurations may be complicated. RF switches in the FEM may also be complex. The RF switches may have performance indices including an insertion loss (IL), isolation (ISO), and maximum handling power (Pmax). The RF switch may be positioned at a rear end of a power amplifier (PA) and a front end of a low noise amplifier (LNA) in the FEM so the performance of the IL may be important.

As the complexity of the RF switch increases, the number of circuits for driving the RF switch, for example, the number of negative voltage generators (NVG) and buffer circuits, may also increase. By this, chip sizes and driving performance of the RF switch may be increased. A gate terminal and a body terminal of a transistor included in the RF switch may be respectively controlled to operate the transistor so that the number of the negative voltage generators (NVG) and the buffer circuits may further increase.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency (RF) switch includes a switch transistor, and a bias transistor having a body terminal and a first terminal connected to each other, a diode-connected configuration, and configured to provide a first current to a body terminal of the switch transistor corresponding to a voltage applied to a control terminal of the switch transistor.

The RF switch may further include an impedance element connected between a first terminal of the switch transistor and a ground, and providing a path for the first current.

The impedance element may be a resistor.

The impedance element may include at least one of a resistor, an inductor, and a diode.

A path of the first current may be formed in order of the control terminal of the switch transistor, the bias transistor, the body terminal of the switch transistor, the first terminal of the switch transistor, the impedance element, and the ground.

The first terminal of the bias transistor may be a source terminal.

The bias transistor may be a p-type transistor.

The body terminal of the bias transistor may be connected to the body terminal of the switch transistor, and a second terminal and a control terminal of the bias transistor may be connected to the control terminal of the switch transistor.

The bias transistor may be an n-type transistor.

The body terminal of the bias transistor may be connected to the control terminal of the switch transistor, and a second terminal and a control terminal of the bias transistor may be connected to the body terminal of the switch transistor.

The switch transistor may be connected between a first port and a second port, the RF switch may further include an additional switch transistor connected between the second port and a ground and turned off when the switch transistor is turned on, and a current path of the first current may be formed by a resistor connected between a first terminal and a second terminal of the additional switch transistor.

In another general aspect, a radio frequency (RF) switch includes a switch transistor, and a bias transistor having a body terminal connected to a body terminal of the switch transistor, a control terminal connected to a control terminal of the switch transistor, and configured to provide a first current to the body terminal of the switch transistor corresponding to a voltage applied to the control terminal of the switch transistor.

The body terminal of the bias transistor may be connected to a first terminal of the bias transistor, and the control terminal of the bias transistor may be connected to a second terminal of the bias transistor.

In another general aspect, a radio frequency (RF) switch includes a switch transistor, and a bias transistor having a body terminal connected to a control terminal of the switch transistor, a control terminal connected to a body terminal of the switch transistor, and configured to provide a first current to the body terminal of the switch transistor corresponding to a voltage applied to the control terminal of the switch transistor.

The body terminal of the bias transistor may be connected to a first terminal of the bias transistor, and the control terminal of the bias transistor may be connected to a second terminal of the bias transistor.

In another general aspect, a radio frequency (RF) switch includes a switch transistor, and a bias transistor configured to reduce a voltage between a body terminal and a first terminal of the switch transistor, and configured to provide a first current to the body terminal of the switch transistor corresponding to a voltage applied to a control terminal of the switch transistor.

The bias transistor may include a body terminal and a first terminal connected to each other, and a diode-connected configuration.

The bias transistor may include a body terminal connected to the body terminal of the switch transistor, and a control terminal connected to the control terminal of the switch transistor.

The bias transistor may include a body terminal connected to the control terminal of the switch transistor, and a control terminal connected to the body terminal of the switch transistor.

The RF switch may further include an impedance element connected between the first terminal of the switch transistor and a ground, and providing a path for the first current, wherein the impedance element may include at least one of a resistor, an inductor, and a diode.

Other features and aspects will be apparent from the following detailed description, the drawings, and the claims.

BRIEF DESCRIPTION OF THE DRAWINGS

FIG. 3 shows an equivalent circuit when an RF switch of FIG. 1 is turned on.

FIG. 7 shows an equivalent circuit when an RF switch of FIG. 6 is turned on.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
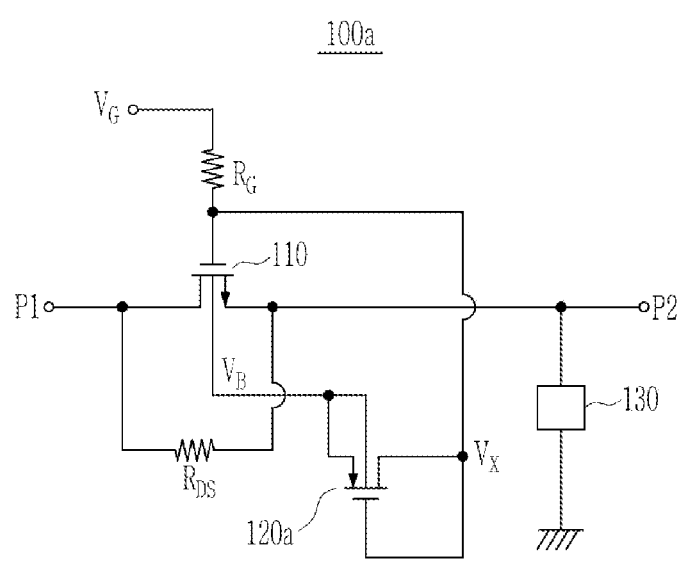
FIG. 1 shows an RF switch according to an embodiment.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

A radio frequency (RF) signal may have a form of Wi-Fi (IEEE 802.11 family and others), WiMAX (IEEE 802.16 family and others), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and other arbitrary wired and wireless protocols, and it is not limited thereto.

The present disclosure may provide an RF switch for reducing an insertion loss (IL).

The present disclosure may provide an RF switch for reducing the number of driving circuits.

FIG. 1 shows an RF switch 100a according to an embodiment.

As shown in FIG. 1, the RF switch 100a may include a switch transistor 110, a bias transistor 120a, a resistor $R_G$, a resistor $R_{DS}$, and an impedance element 130.

The switch transistor 110 may be connected between a first port P1 and a second port P2, and may switch an RF path formed between the first port P1 and the second port P2. When the switch transistor 110 is turned on, the first port P1 is connected to the second port P2, and the RF signal may be accordingly transmitted. When the switch transistor 110 is turned off, the first port P1 is not connected to the second port P2, and the RF signal may then be intercepted. The switch transistor 110 may be realized with various types of transistors such as a field-effect transistor (FET) functioning as a switch and a bipolar transistor. The n-type switch transistor 110 is shown in FIG. 1, and it may be replaced with a p-type switch transistor. For better understanding and ease of description, the switch transistor 110 is assumed to be an FET, but it may be replaced with other transistors.

The switch transistor 110 may include a gate terminal, a drain terminal, a source terminal, and a body terminal. Here, the gate terminal may be a control terminal. The drain terminal of the switch transistor 110 may be connected to the first port P1, and the source terminal of the switch transistor 110 may be connected to the second port P2. The gate terminal of the switch transistor 110 may be connected to a first end of the resistor $R_G$, and a gate voltage $V_G$ may be applied to a second end of the resistor $R_G$. The gate voltage $V_G$ is a turn-on voltage of the switch transistor 110 and may have a positive (+) voltage, and the gate voltage $V_G$ is a turn-off voltage of the switch transistor 110 and may have a 0 V or negative (−) voltage. Here, the resistor $R_G$ is a gate resistor, and it may prevent the RF signal from leaking to the gate terminal of the switch transistor 110 when the switch transistor 110 is turned on or off. As the resistor $R_G$ is coupled to the body terminal of the switch transistor 110, the resistor $R_G$ may prevent the RF signal from leaking to the body terminal of the switch transistor 110 when the switch transistor 110 is turned on or off.

The resistor $R_{DS}$ may be connected between the drain terminal and the source terminal of the switch transistor 110. The resistor $R_{DS}$ may maintain a direct current (DC) voltage between the drain terminal and the source terminal of the switch transistor 110 when the switch transistor 110 is turned off.

The bias transistor 120a may include a gate terminal, a drain terminal, a source terminal, and a body terminal. Here, the gate terminal may be a control terminal. For example, the bias transistor 120a may be a p-type FET. The body terminal of the bias transistor 120a may be connected to the body terminal of the switch transistor 110, and the gate terminal of the bias transistor 120a may be connected to the gate terminal of the switch transistor 110. The gate terminal and the drain terminal of the bias transistor 120a are connected to each other so the bias transistor 120a has a diode-connected configuration. The body terminal and the source terminal of the bias transistor 120a are connected to each other, and the bias transistor 120a may provide a leakage current to the body terminal of the switch transistor 110. That is, the bias transistor 120a may correspond to the gate voltage $V_G$, and may provide the leakage current to the body terminal of the switch transistor 110. Referring to FIG. 1, the voltage applied to the body terminal of the switch transistor 110 is referred to as a body voltage $V_B$, and a voltage at a node on which the gate terminal of the switch transistor 110 is connected to the gate terminal of the bias transistor 120a is referred to as $V_X$. Here, the gate voltage $V_G$ may be applied to the body terminal of the switch transistor 110 through the resistor $R_G$ and the bias transistor 120a.

Figure 2:
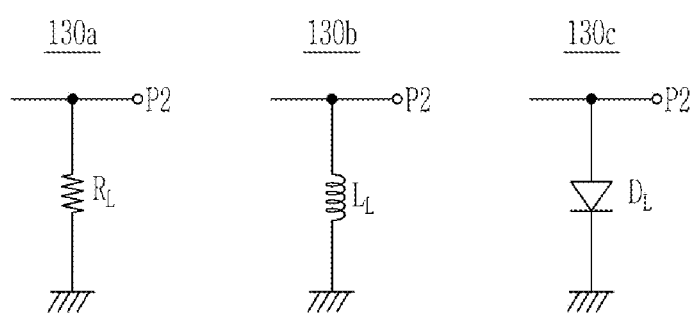
FIG. 2 shows various examples of an impedance element according to embodiments.

The impedance element 130 may be connected between the source terminal of the switch transistor 110 and a ground. The impedance element 130 may provide a path so that a leakage current generated by the bias transistor 120a may flow thereon. FIG. 2 shows various examples of an impedance element according to embodiments. Referring to 130a as shown in FIG. 2, the impedance element 130 may be a resistor $R_L$, referring to 130b, the impedance element 130 may be an inductor $L_L$, and referring to 130c, the impedance element 130 may be a diode $D_L$. The impedance element 130 may be realized with at least one of the resistor $R_L$, the inductor $L_L$, and the diode $D_L$. A case in which the impedance element 130 is realized with the resistor $R_L$ will now be assumed and described.

Referring to FIG. 1, when the switch transistor 110 is turned on, a leakage current path may be formed in order of the gate voltage $V_G$, the resistor $R_G$, the bias transistor 120a, the body terminal of the switch transistor 110, the source terminal of the switch transistor 110, the impedance element 130, and the ground. By the leakage current path, the body voltage $V_B$ may be generated, and turn-on resistance $R_{ON}$ of the switch transistor 110 may be reduced. This will now be described in detail with reference to FIG. 3.

Figure 3:
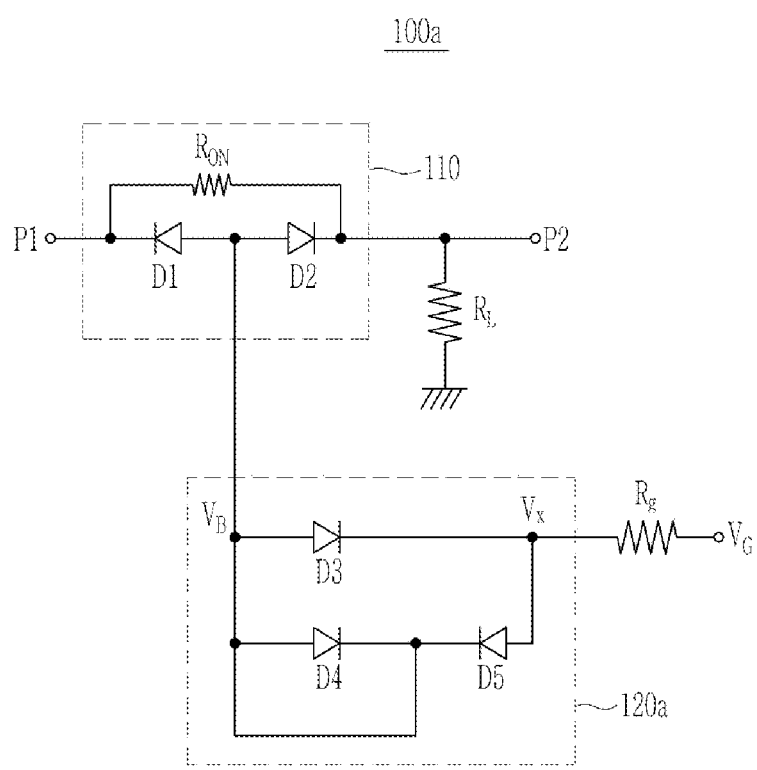

FIG. 3 shows an equivalent circuit when an RF switch 100a of FIG. 1 is turned on. Here, the impedance element 130 is assumed to be the resistor $R_L$.

Referring to FIG. 3, the switch transistor 110 may be configured with the turn-on resistor $R_{ON}$, a diode D1, and a diode D2 when the switch transistor 110 is turned on. The diode D1 is formed between the body terminal and the drain terminal of the switch transistor 110, and the diode D2 is formed between the body terminal and the source terminal of the switch transistor 110.

The bias transistor 120a may be configured with a diode D3, a diode D4, and a diode D5. The diode D3 shows that the bias transistor 120a has a diode-connected configuration. The diode D4 is formed between the source terminal and the body terminal of the bias transistor 120a, and the diode D5 is formed between the drain terminal and the body terminal of the bias transistor 120a. Here, as the body terminal and the source terminal of the bias transistor 120a are connected to each other, an anode and a cathode of the diode D4 are connected to each other.

Figure 4:
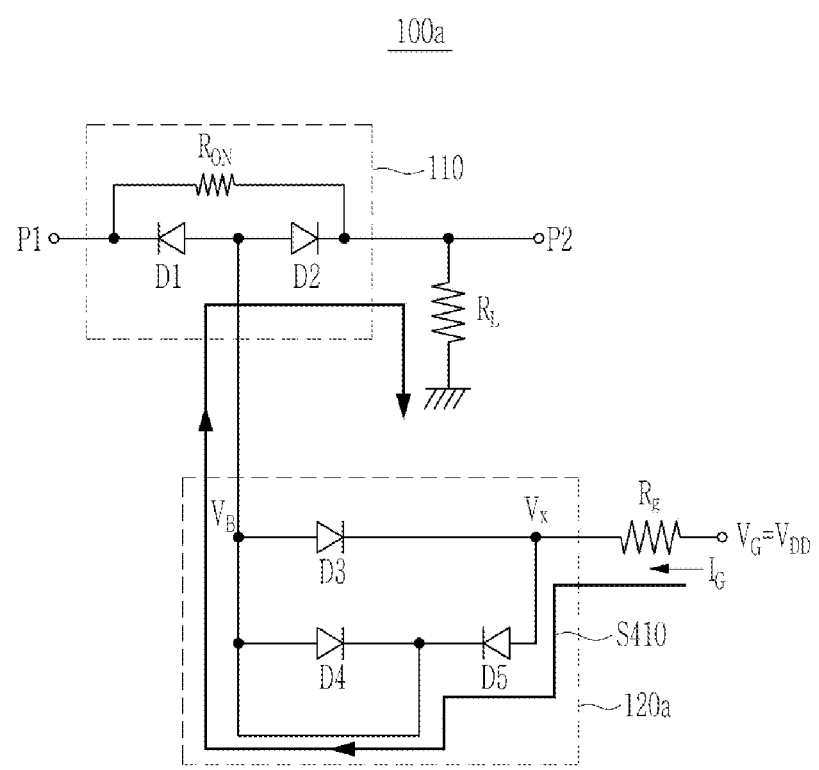
FIG. 4 shows a current path for an equivalent circuit of FIG. 3.

FIG. 4 shows a current path for an equivalent circuit of FIG. 3.

When the switch transistor 110 is turned on, the gate voltage $V_G$ may have a positive (+) voltage. Here, the positive (+) gate voltage $V_G$ will be assumed to be a voltage $V_{DD}$. In this instance, a current $I_G$ is formed. The current $I_G$ may be expressed as Equation 1.

$$I_G = \frac{(V_{DD} - V_X)}{R_G} \quad \text{(Equation 1)}$$

The voltage $V_{DD}$ may be set to turn on the diode D5 and the diode D2. Hence, the current path S410 may be formed in order of the gate voltage $V_G$, the resistor $R_G$, the diode D5, the diode D2, the resistor $R_L$, and the ground. The current path S410 represents a path for the leakage current described with reference to FIG. 1.

By the current path S410, the body voltage $V_B$ may be expressed as in Equation 2.

$$V_B = I_G \times R_L + V_{D2} \quad \text{(Equation 2)}$$

$V_{D2}$ is the turn-on voltage of the diode D2.

Referring to Equation 2, the body voltage $V_B$ is set to be higher than the general voltage of 0 V, and the turn-on resistance $R_{ON}$ of the switch transistor 110 is reduced. The insertion loss IL of the switch transistor 110 may be reduced by the reduction of the turn-on resistance $R_{ON}$. This will now be described in further detail.

The turn-on resistance $R_{ON}$ of the switch transistor 110 may be expressed as Equation 3.

$$R_{ON} = \frac{1}{\mu_n C_{ox} \frac{W}{L}(V_{GS} - V_{TH})} \quad \text{(Equation 3)}$$

Here, $\mu_n$ is electron mobility of the channel, and $C_{ox}$ is capacitance per unit area on the capacitor formed between the gate terminal and the channel. W is a width of the channel, and L is a length of the channel. $V_{GS}$ is a voltage between the gate terminal and the source terminal, and $V_{TH}$ is a threshold voltage.

$V_{TH}$ may be expressed as Equation 4.

$$V_{TH} = V_{TH0} + \gamma(\sqrt{|2\Phi_F + V_{SB}|} + \sqrt{|2\Phi_F|}) \quad \text{(Equation 4)}$$

Here, $V_{TH0}$ is a natural threshold voltage, and $\Phi_F$ is a difference of a work function of a polysilicon gate and a work function of a silicon substrate. $\gamma$ is a body effect coefficient, and $V_{SB}$ is a voltage between the source terminal and the body terminal of the switch transistor 110.

Referring to Equation 2, regarding the switch transistor 110 according to an embodiment, the body voltage $V_B$ is higher than the general case of the voltage of 0 V. Accordingly, regarding the switch transistor 110 according to an embodiment, $V_{SB}$ is reduced compared to the general case, and $V_{TH}$ is also reduced referring to Equation 4. Referring to Equation 3, as $V_{TH}$ is reduced, the turn-on resistance $R_{ON}$ of the switch transistor 110 is reduced. As the turn-on resistance $R_{ON}$ of the switch transistor 110 is reduced, the RF switch 100a may reduce the insertion loss IL. In other words, the RF switch 100a may reduce the insertion loss IL by generating the leakage current through the bias transistor 120a.

The RF switch 100a may reduce the number of driving circuits (e.g., buffer circuits) by applying the body voltage $V_B$ by use of the gate voltage $V_G$. That is, the RF switch 100a needs no additional driving circuits (e.g., buffer circuits) for applying the body voltage $V_B$.

Figure 5:
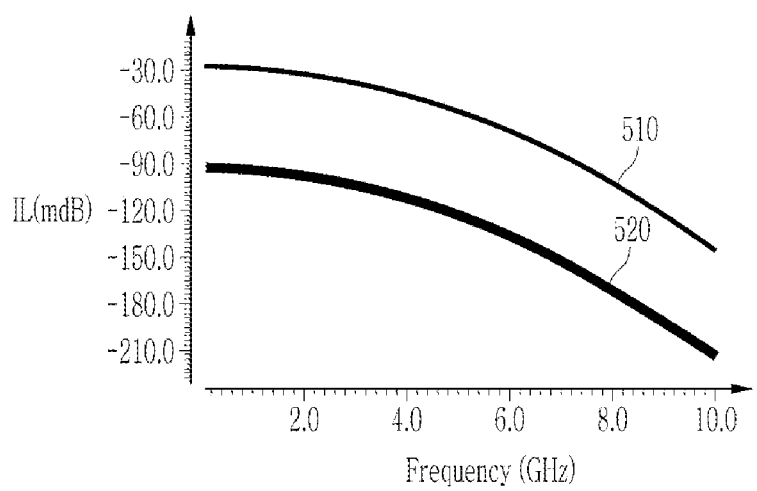
FIG. 5 shows a graph of simulation results on a general RF switch and an RF switch according to an embodiment.

FIG. 5 shows a graph of simulation results on a general RF switch and an RF switch 100a according to an embodiment.

Referring to FIG. 5, a horizontal axis represents the frequency, and the vertical axis represents the insertion loss IL. Here, the insertion loss IL may be a parameter of S21. 520 shows a simulation result of the general RF switch, and 510 shows a simulation result of the RF switch 100a according to an embodiment. The general RF switch has no leakage current path when it is turned on, and it applies an additional body voltage of 0 V to the body terminal.

Referring to 510 and 520, it is found that the insertion loss IL of the RF switch 100a is reduced compared to the general RF switch.

Figure 6:
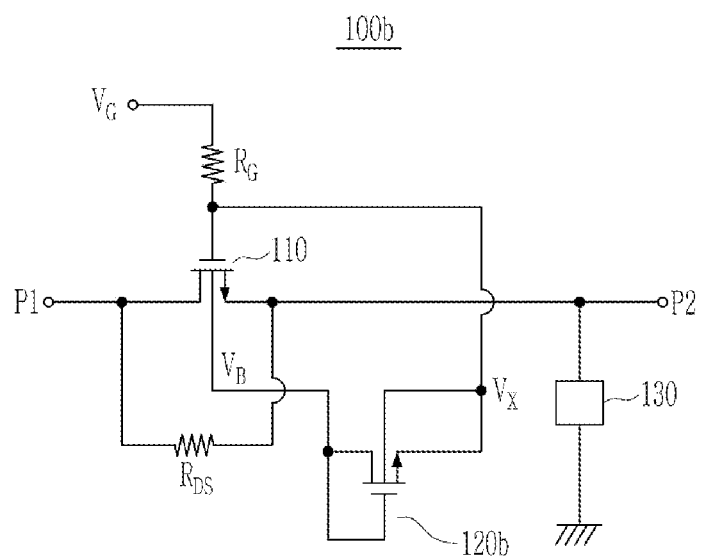
FIG. 6 shows an RF switch according to another embodiment.

FIG. 6 shows an RF switch 100b according to another embodiment.

As shown in FIG. 6, the RF switch 100b may include a switch transistor 110, a bias transistor 120b, a resistor $R_G$, a resistor $R_{DS}$, and an impedance element 130. The RF switch 100b shown in FIG. 6 is similar to the RF switch 100a shown in FIG. 1 except that the bias transistor 120b is an n-type transistor, so no repeated description will be provided.

The bias transistor 120b may have a gate terminal, a drain terminal, a source terminal, and a body terminal. The gate terminal may be a control terminal. For example, the bias transistor 120b may be an n-type FET. The body terminal of the bias transistor 120b may be connected to the gate terminal of the switch transistor 110, and the source terminal of the bias transistor 120b may be connected to the gate terminal of the switch transistor 110 and the body terminal of the bias transistor 120b. The gate terminal and the drain terminal of the bias transistor 120b may be connected to the body terminal of the switch transistor 110. The gate terminal and the drain terminal of the bias transistor 120b are connected to each other so the bias transistor 120b has a diode-connected configuration. Here, the body terminal and the source terminal of the bias transistor 120b are connected to each other so the bias transistor 120b may provide a leakage current to the body terminal of the switch transistor 110. The bias transistor 120b may correspond to the gate voltage $V_G$ and may provide the leakage current to the body terminal of the switch transistor 110.

Referring to FIG. 6, when the switch transistor 110 is turned on, a leakage current path may be formed in order of the gate voltage $V_G$, the resistor $R_G$, the bias transistor 120b, the body terminal of the switch transistor 110, the source terminal of the switch transistor 110, the impedance element 130, and the ground. The body voltage $V_B$ is generated by the leakage current path, and the turn-on resistance $R_{ON}$ of the switch transistor 110 may be decreased. This will now be described in detail with reference to FIG. 7.

Figure 7:
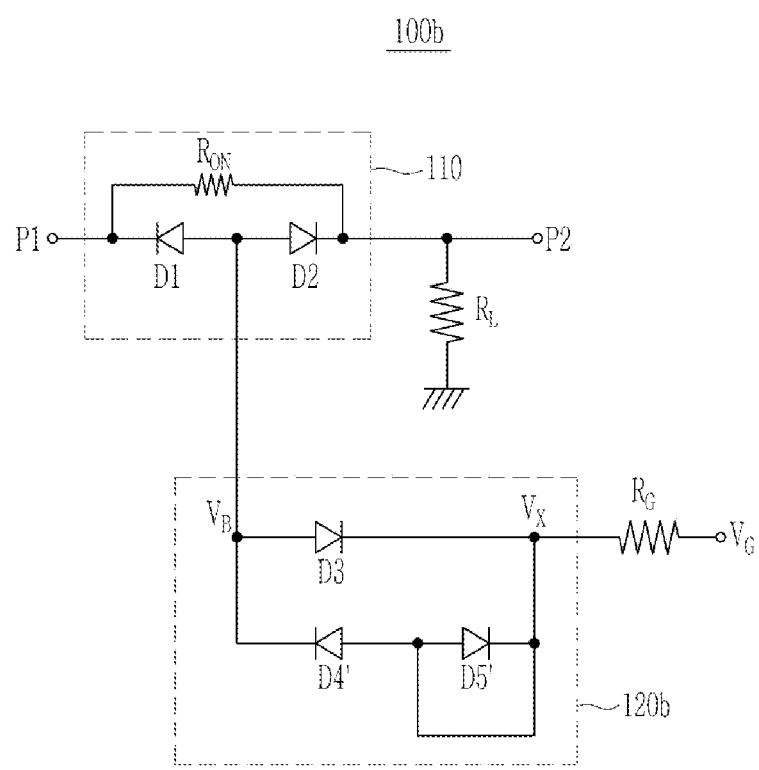

FIG. 7 shows an equivalent circuit when an RF switch 100b of FIG. 6 is turned on. Here, the impedance element 130 is assumed to be a resistor $R_L$.

Referring to FIG. 7, the switch transistor 110 may be configured with a turn-on resistor $R_{ON}$, a diode D1, and a diode D2 when the switch transistor 110 is turned on. The diode D1 is formed between the body terminal and the drain terminal of the switch transistor 110, and the diode D2 is formed between the body terminal and the source terminal of the switch transistor 110.

The bias transistor 120b may be configured with a diode D3, a diode D4', and a diode D5'. The diode D3 shows that the bias transistor 120b has a diode-connected configuration. The diode D4' is formed between the body terminal and the drain terminal of the bias transistor 120b, and the diode D5' is formed between the body terminal and the source terminal of the bias transistor 120b. As the body terminal and a source terminal of the bias transistor 120b are connected to each other, an anode and a cathode of the diode D5' are connected to each other.

Figure 8:
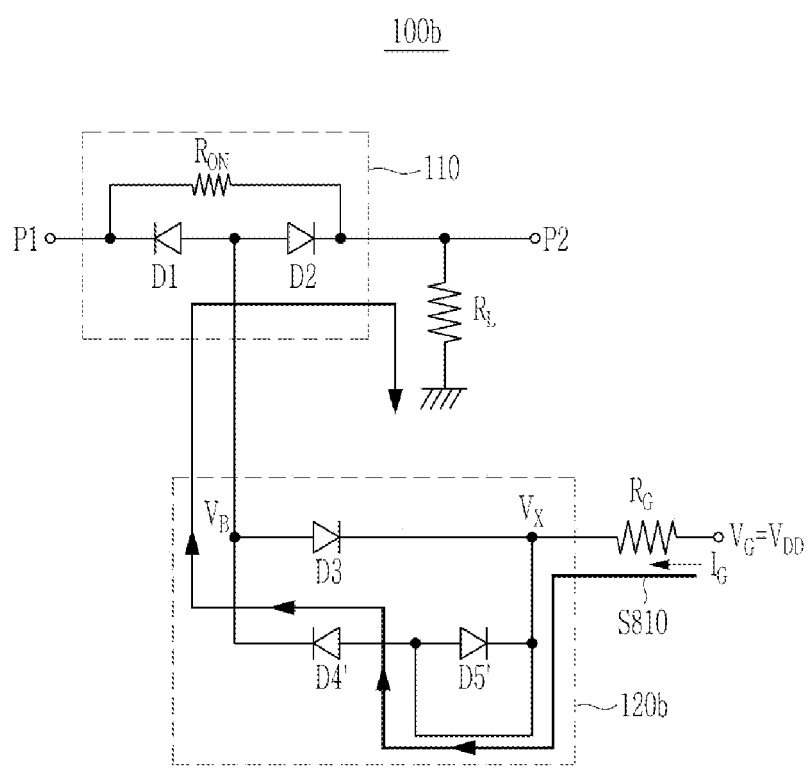
FIG. 8 shows a current path for an equivalent circuit of FIG. 7.

FIG. 8 shows a current path for an equivalent circuit of FIG. 7.

When the switch transistor 110 is turned on, the gate voltage $V_G$ may be a positive (+) voltage, and the positive (+) gate voltage $V_G$ will be assumed to be the voltage $V_{DD}$. In this instance, a current $I_G$ is formed. The current $I_G$ may be expressed as in Equation 1.

The $V_{DD}$ may be set to turn on the diode D4' and the diode D2. Hence, the current path S810 may be formed in order of the gate voltage $V_G$, the resistor $R_G$, the diode D4', the diode D2, the resistor $R_L$, and the ground. The current path S810 is the leakage current path.

By the current path S810, the body voltage $V_B$ may be expressed as in Equation 2. The body voltage $V_B$ is set to be higher than the general voltage of 0 V, and the turn-on resistance $R_{ON}$ of the switch transistor 110 is reduced as described with reference to Equations 3 and 4. The insertion loss IL of the switch transistor 110 may be reduced by the reduction of the turn-on resistance $R_{ON}$.

The RF switch 100b according to this embodiment may reduce the number of driving circuits (e.g., buffer circuits) by applying the body voltage $V_B$ by use of the gate voltage $V_G$.

Further, as the RF switch 100b applies the body voltage $V_B$ by using the gate voltage $V_G$, the number of the driving circuits (e.g., buffer circuits) may be reduced.

Figure 9:
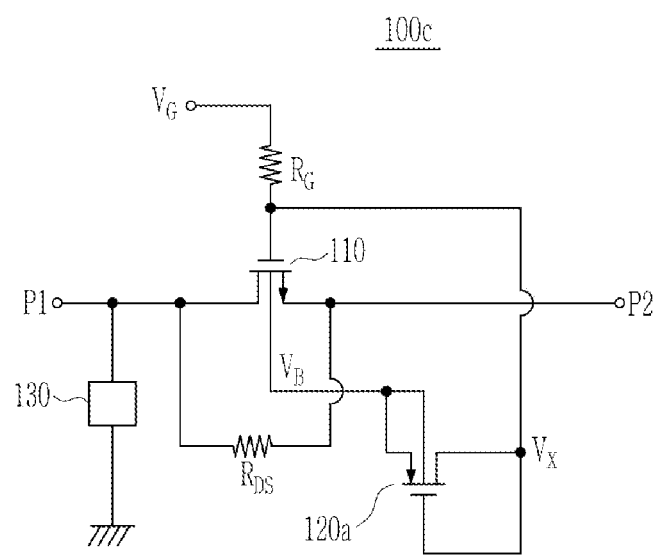
FIG. 9 shows an RF switch according to another embodiment.

FIG. 9 shows an RF switch 100c according to another embodiment.

The RF switch 100c shown in FIG. 9 is similar to the RF switch 100a shown in FIG. 1 except that the position of the impedance element 130 is changed in the RF switch 100a of FIG. 1. As shown in FIG. 9, the impedance element 130 may be connected between the drain terminal of the switch transistor 110 and the ground. Referring to FIG. 3, the diode D2 and the diode D1 are symmetrical to each other in the equivalent circuit of the switch transistor 110. Accordingly, when the impedance element 130 is connected between the drain terminal of the switch transistor 110 and the ground, the impedance element 130 may provide the leakage current path. That is, when the switch transistor 110 is turned on, the leakage current path is formed in order of the gate voltage $V_G$, the resistor $R_G$, the bias transistor 120a, the body terminal of the switch transistor 110, the drain terminal of the switch transistor 110, the impedance element 130, and the ground.

Figure 10:
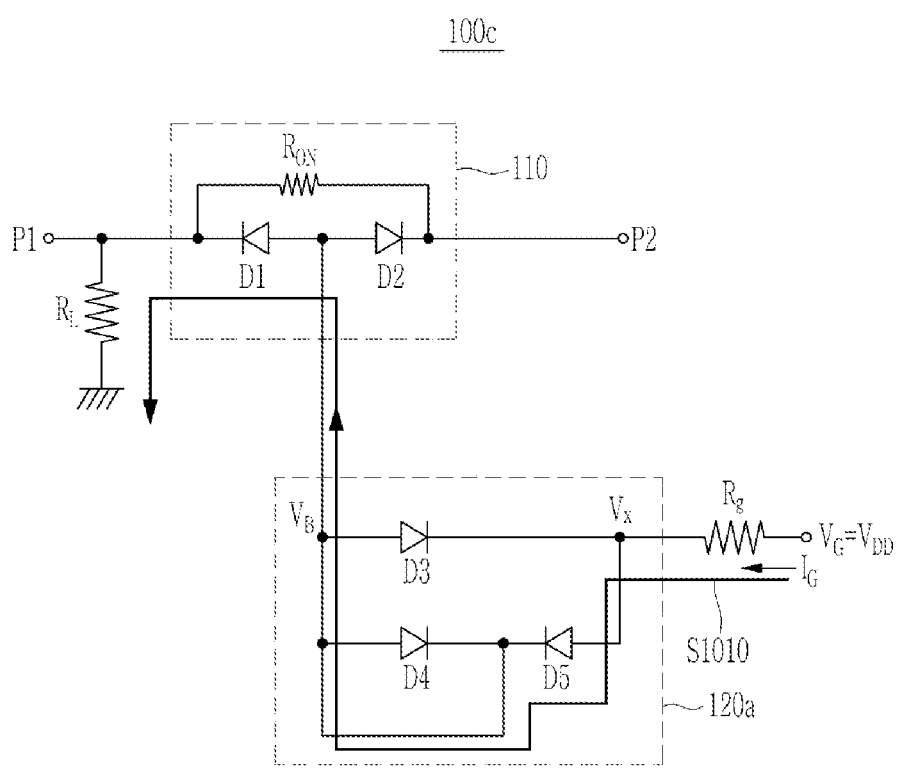
FIG. 10 shows an equivalent circuit of an RF switch of FIG. 9 and a current path thereof.

FIG. 10 shows an equivalent circuit of an RF switch 100c of FIG. 9 and a current path thereof. The impedance element 130 is assumed to be the resistor $R_L$.

Referring to FIG. 10, a current path S1010 may be formed in order of the gate voltage $V_G$, the resistor $R_G$, the diode D5, the diode D1, the resistor $R_L$, and the ground. The current path S1010 is the leakage current path. By the current path S1010, the body voltage $V_B$ may be expressed as in Equation 5.

$$V_B = I_G \times R_L + V_{D1} \quad \text{(Equation 5)}$$

Here, $V_{D1}$ is the turn-on voltage of the diode D1. When Equation 2 is compared to Equation 5, Equation 5 is equivalent to Equation 2 except that $V_{D2}$ in Equation 2 is replaced with $V_{D1}$.

The body voltage $V_B$ is set to be higher than the general voltage of 0 V, and the turn-on resistance $R_{ON}$ of the switch transistor 110 is reduced as expressed with Equations 3 and 4. As the turn-on resistance $R_{ON}$ is reduced, the insertion loss IL of the switch transistor 110 may be reduced.

Figure 11:
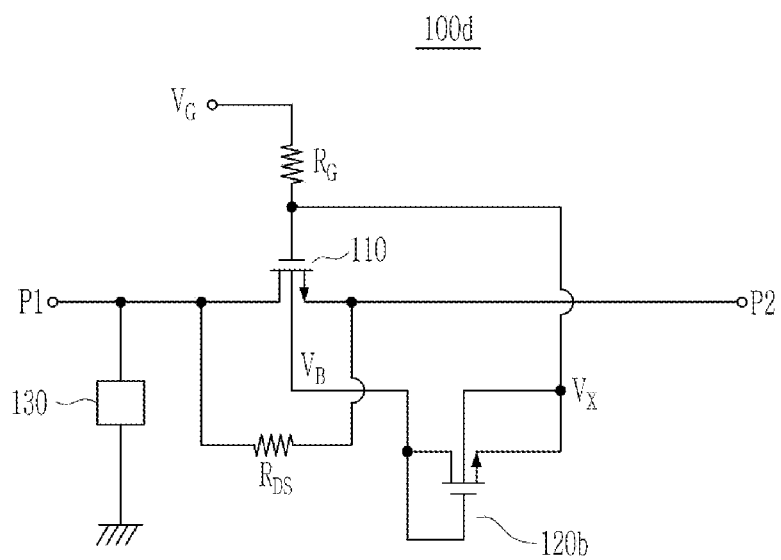
FIG. 11 shows an RF switch according to another embodiment.

FIG. 11 shows an RF switch 100d according to another embodiment.

The RF switch 100d of FIG. 11 is similar to the RF switch 100b of FIG. 6 except that the position of the impedance element 130 is changed in the RF switch 100b of FIG. 6. As shown in FIG. 11, the impedance element 130 may be connected between the drain terminal of the switch transistor 110 and the ground. Referring to FIG. 7, the diode D2 and the diode D1 are symmetrical to each other in the equivalent circuit of the switch transistor 110. Hence, when the impedance element 130 is connected between the drain terminal of the switch transistor 110 and the ground, the impedance element 130 may provide the leakage current path. That is, when the switch transistor 110 is turned on, a leakage current path may be formed in order of the gate voltage $V_G$, the resistor $R_G$, the bias transistor 120b, the body terminal of the switch transistor 110, the drain terminal of the switch transistor 110, the impedance element 130, and the ground.

Figure 12:
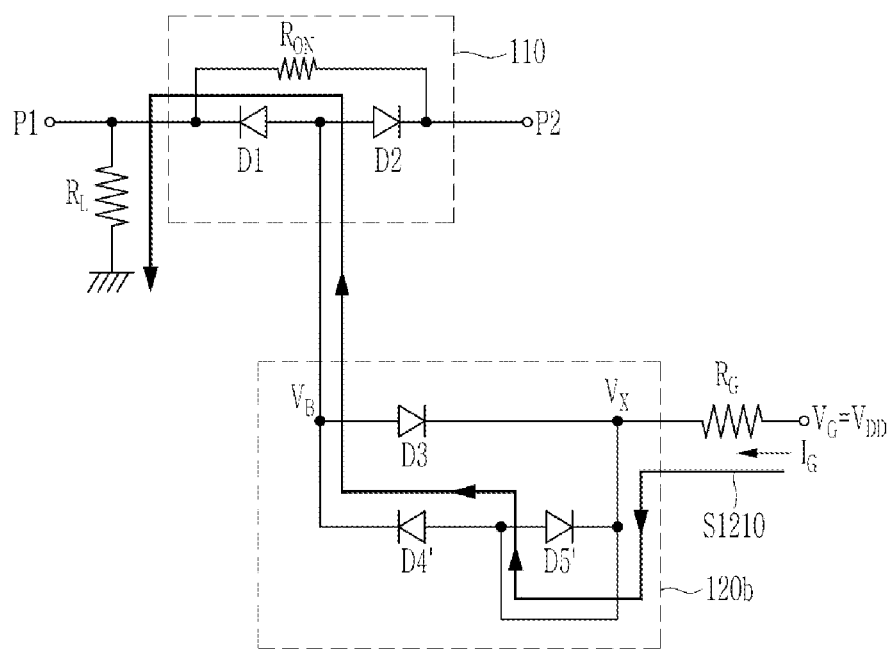
FIG. 12 shows an equivalent circuit of an RF switch of FIG. 11 and a current path thereof.

FIG. 12 shows an equivalent circuit of an RF switch 100d of FIG. 11 and a current path thereof. The impedance element 130 is assumed to be the resistor $R_L$.

Referring to FIG. 12, a current path S1210 may be formed in order of the gate voltage $V_G$, the resistor $R_G$, the diode D4', the diode D1, the resistor $R_L$, and the ground. The current path S1210 is a leakage current path. By the current path S1210, the body voltage $V_B$ may be expressed as in Equation 5.

The body voltage $V_B$ is set to be higher than the general voltage of 0 V, and the turn-on resistance $R_{ON}$ of the switch transistor 110 is reduced as described with reference to Equations 3 and 4. The insertion loss IL of the switch transistor 110 may be reduced by the reduction of the turn-on resistance $R_{ON}$.

Figure 13:
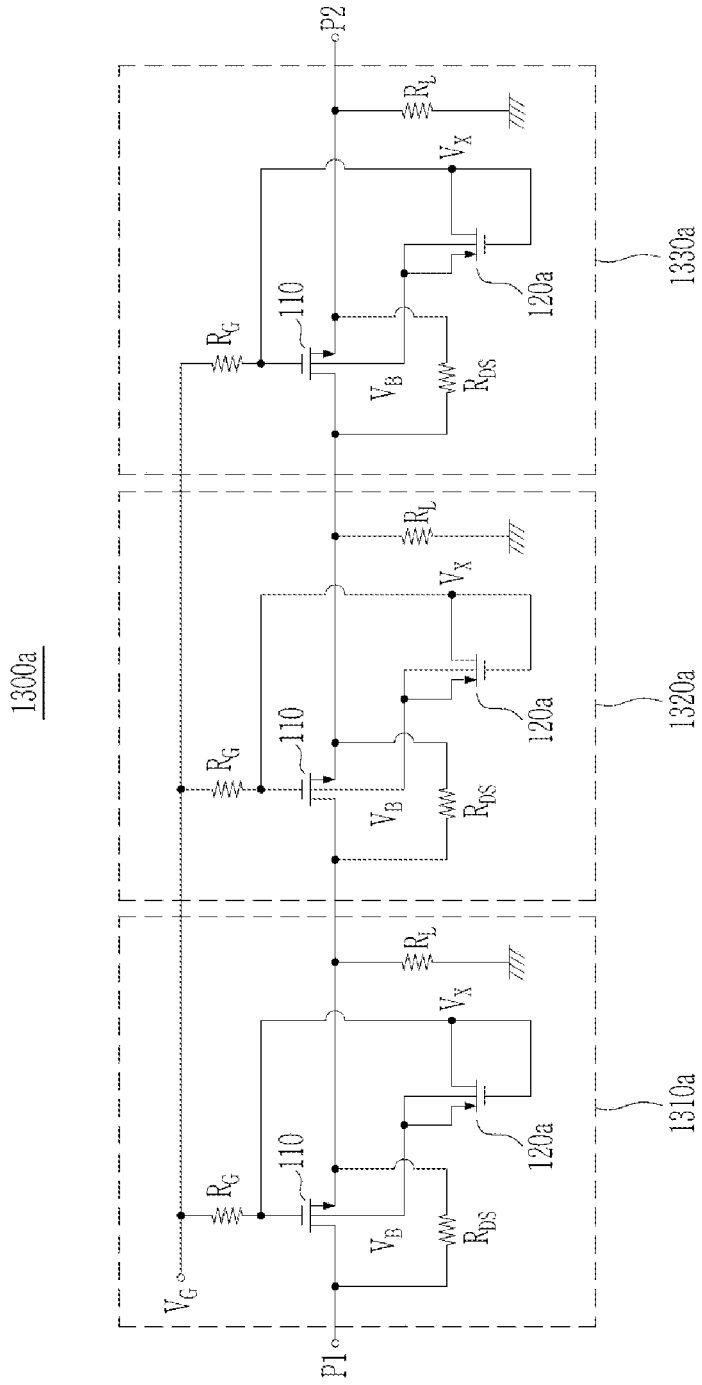
FIG. 13 shows an RF switch system according to an embodiment.

FIG. 13 shows an RF switch system 1300a according to an embodiment.

As shown in FIG. 13, the RF switch system 1300a may include a plurality of switch cells 1310a, 1320a, and 1330a. Regarding the RF switch system 1300a, to improve a withstand voltage, a plurality of switch cells 1310a, 1320a, and 1330a may be stacked between the first port P1 and the second port P2. FIG. 13 shows that three switch cells 1310a, 1320b, and 1330b are stacked, and at least two switch cells may be stacked.

As shown in FIG. 13, the respective switch cells 1310a, 1320a, and 1330a may be the RF switch 100a of FIG. 1. The respective switch cells 1310a, 1320a, and 1330a may be replaced with one of the RF switch 100b of FIG. 6, the RF switch 100c of FIG. 9, and the RF switch 100d of FIG. 11. The gate voltage $V_G$ is applied in common to the switch cells 1310a, 1320a, and 1330a, and by this, the switch cells 1310a, 1320a, and 1330a are simultaneously turned on or off.

Figure 14:
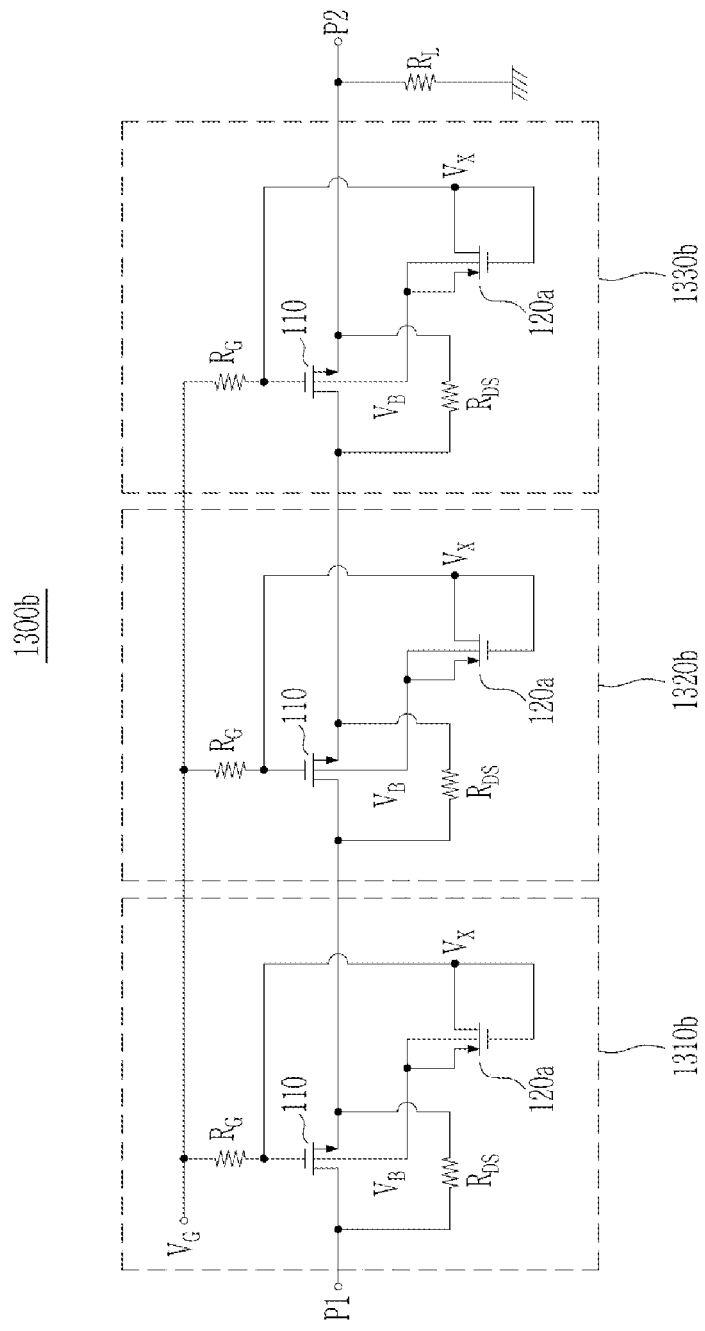
FIG. 14 shows an RF switch system according to another embodiment.

FIG. 14 shows an RF switch system 1300b according to another embodiment.

As shown in FIG. 14, the RF switch system 1300b may include a plurality of switch cells 1310b, 1320b, and 1330b. The RF switch system 1300b of FIG. 14 is similar to the RF switch system 1300a of FIG. 13 except that one resistor $R_L$ forms the leakage current path. The resistor element $R_L$ included in the respectively switch cells 1310a, 1320a, and 1330a of FIG. 13 may be combined into one, which is shown in FIG. 14. That is, three resistor elements $R_L$ may be disposed in FIG. 13, and one resistor element $R_L$ may be disposed in FIG. 14. Meanwhile, in FIG. 14, the resistor $R_L$ may be positioned between the second port P2 and the ground, and may be positioned between a point on a path between the first port P1 and the second port P2 and the ground. The leakage currents generated by the respective switch cells 1310b, 1320b, and 1330b may flow to the ground through the resistor $R_L$.

Figure 15:
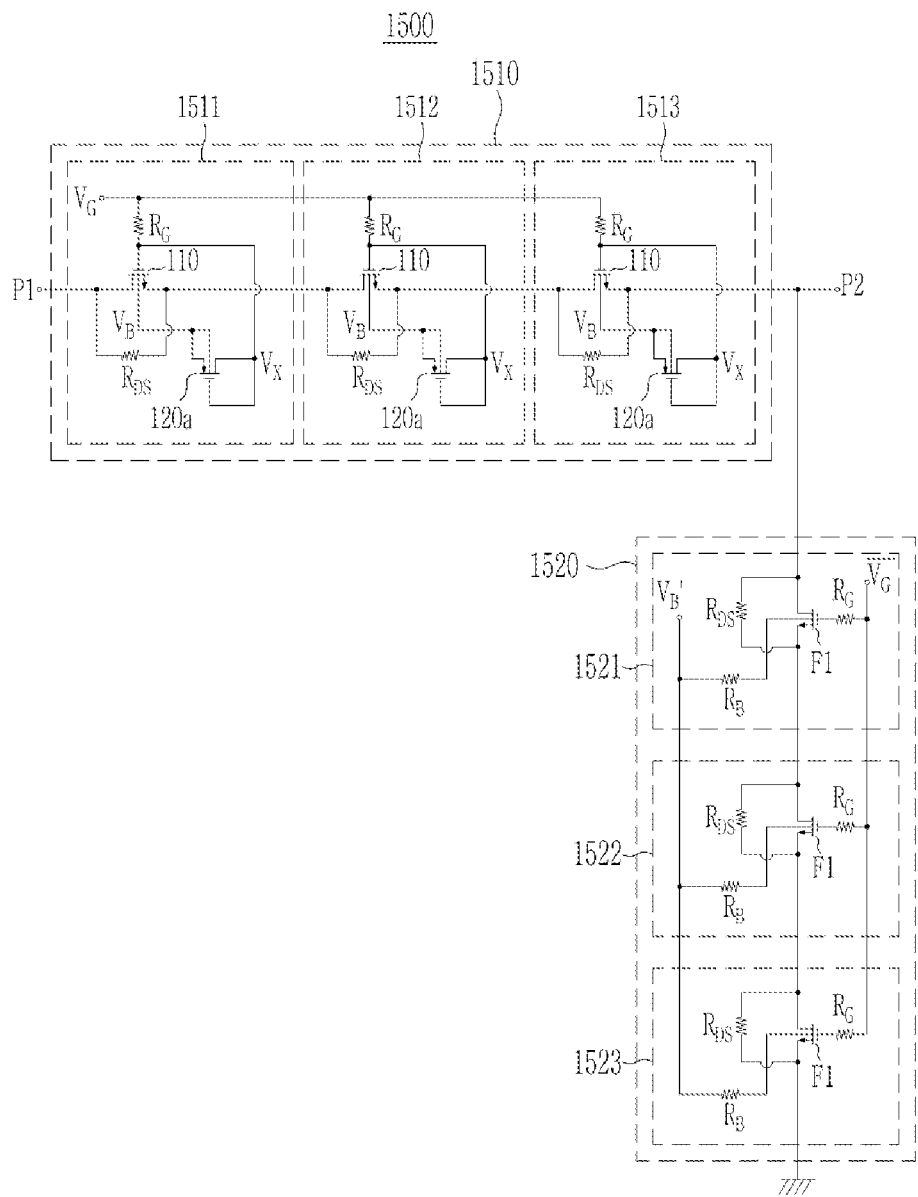
FIG. 15 shows an RF switch system according to another embodiment.

FIG. 15 shows an RF switch system 1500 according to another embodiment.

As shown in FIG. 15, the RF switch system 1500 may include a series switch 1510 and a shunt switch 1520. The series switch 1510 may be connected between the first port P1 and the second port P2, and the shunt switch 1520 may be connected between the second port P2 and the ground. When the series switch 1510 is turned on, the shunt switch 1520 is turned off. When the series switch 1510 is turned off, the shunt switch 1520 is turned on. That is, the RF switch system 1500 may have a single pole single throw (SPST) structure.

The series switch 1510 may include a plurality of switch cells 1511, 1512, and 1513, and the switch cells 1511, 1512, and 1513 may be stacked between the first port P1 and the second port P2 to improve a withstand voltage. The gate voltage $V_G$ is applied in common to the switch cells 1511, 1512, and 1513 so the switch cells 1511, 1512, and 1513 are simultaneously turned on or off. The respective switch cells 1511, 1512, and 1513 may be one of the RF switch 100a of FIG. 1, the RF switch 100b of FIG. 6, the RF switch 100c of FIG. 9, and the RF switch 100d of FIG. 11, except that they include no resistor $R_L$. That is, for ease of description, FIG. 15 shows that the switch cells 1511, 1512, and 1513 are the RF switch 100a of FIG. 1, and they may be one of the RF switch 100b of FIG. 6, the RF switch 100c of FIG. 9, and the RF switch 100d of FIG. 11.

The shunt switch 1520 may include a plurality of switch cells 1521, 1522, and 1523, and the switch cells 1521, 1522, and 1523 may be stacked between the second port P2 and the ground so as to improve a withstand voltage. A gate voltage $\overline{V_G}$ is applied in common to the switch cells 1521, 1522, and 1523 so the switch cells 1521, 1522, and 1523 are simultaneously turned on or off. As the gate voltage $\overline{V_G}$ has an opposite phase to the gate voltage $V_G$, the shunt switch 1520 is switched in an opposite way to the series switch 1510.

As shown in FIG. 15, the respective switch cells 1521, 1522, and 1523 may have different switch structures from the switch cells 1511, 1512, and 1513. That is, the respective switch cells 1521, 1522, and 1523 may have no bias transistor. The respective switch cells 1521, 1522, and 1523 may include a switch transistor F1, a resistor $R_G$, and a resistor $R_{DS}$. The resistor $R_G$ may be connected to a gate terminal of the switch transistor F1, and the resistor $R_{DS}$ may be connected between a drain terminal and a source terminal of the switch transistor F1. A body voltage $V_B'$ may be applied in common to a body terminal of the switch transistor F1. The body voltage $V_B'$ may be applied from an additional driving circuit. Here, the resistor $R_G$ of FIG. 15 may perform a same function as the resistor $R_G$ of FIG. 1, and the resistor $R_{DS}$ of FIG. 15 may perform a same function as the resistor $R_{DS}$ of FIG. 1.

The respective switch cells 1511, 1512, and 1513 are one of the RF switch 100a of FIG. 1, the RF switch 100b of FIG. 6, the RF switch 100c of FIG. 9, and the RF switch 100d of FIG. 11, thereby generating the leakage current described with reference to FIG. 1 to FIG. 14. Here, an impedance element 130 (e.g., resistor $R_L$) for providing a path on which the leakage current may flow may be needed, and referring to FIG. 15, the resistor $R_{DS}$ respectively included in the switch cells 1521, 1522, and 1523 may function as noted above. This will now be described in detail with reference to FIG. 16.

Figure 16:
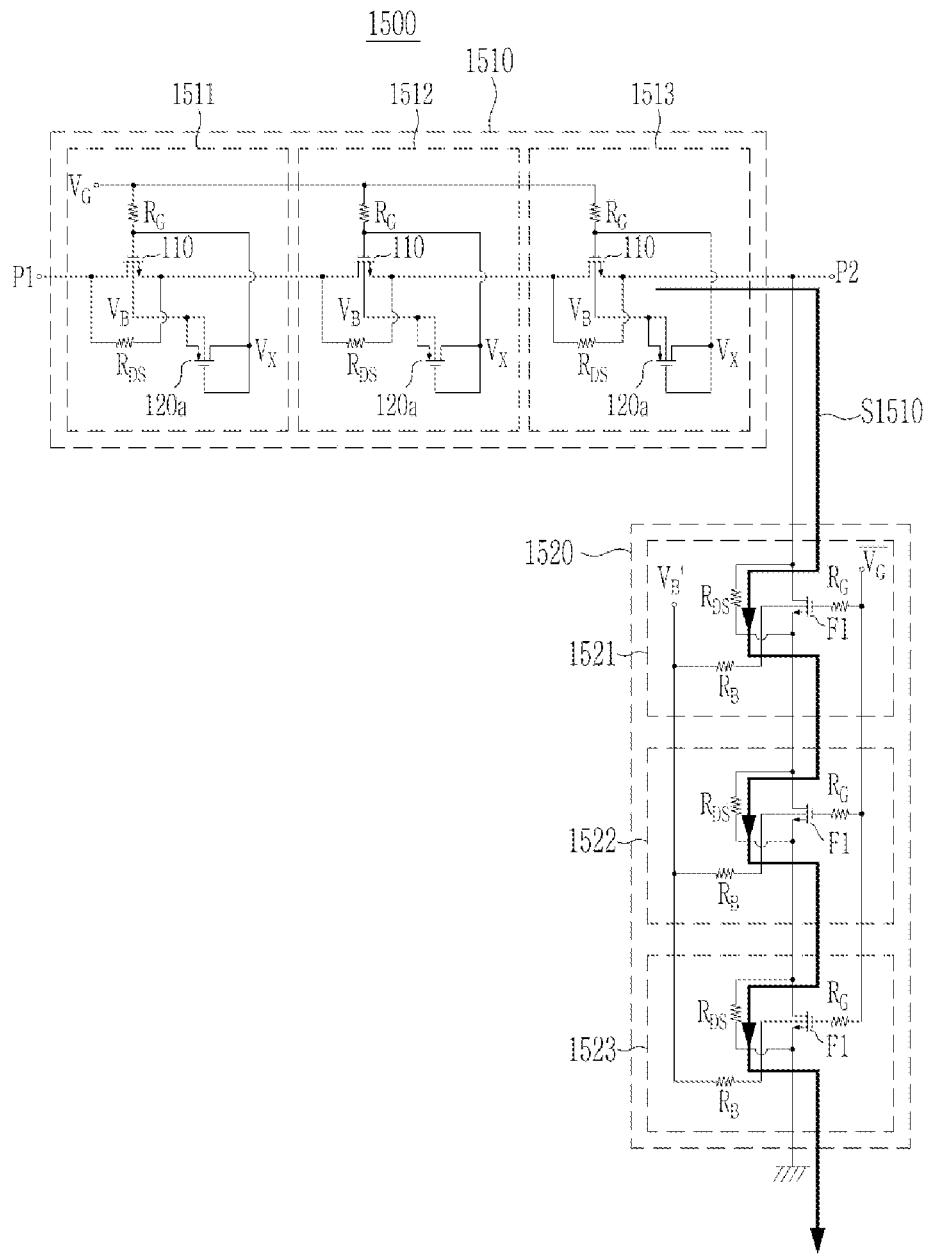
FIG. 16 shows a current path of an RF system of FIG. 15.

FIG. 16 shows a current path of an RF system of FIG. 15.

When the series switch 1510 is turned on, the shunt switch 1520 is turned off. That is, a plurality of switch cells 1511, 1512, and 1513 are simultaneously turned on, and a plurality of switch cells 1521, 1522, and 1523 are simultaneously turned off. Here, the leakage current may be generated by the bias transistors included in the switch cells 1511, 1512, and 1513. The leakage current path S1510 may be formed in order of the resistor $R_{DS}$ of the switch cell 1521, the resistor $R_{DS}$ of the switch cell 1522, the resistor $R_{DS}$ of the switch cell 1523, and the ground. That is, the leakage current path S1510 is formed in order of the series switch 1510, the resistor $R_{DS}$ of the switch cell 1521, the resistor $R_{DS}$ of the switch cell 1522, the resistor $R_{DS}$ of the switch cell 1523, and the ground. The resistor $R_{DS}$ of the switch cell 1521, the resistor $R_{DS}$ of the switch cell 1522, and the resistor $R_{DS}$ of the switch cell 1523 may function as the resistor $R_L$ of FIG. 13 and FIG. 14.

Figure 17:
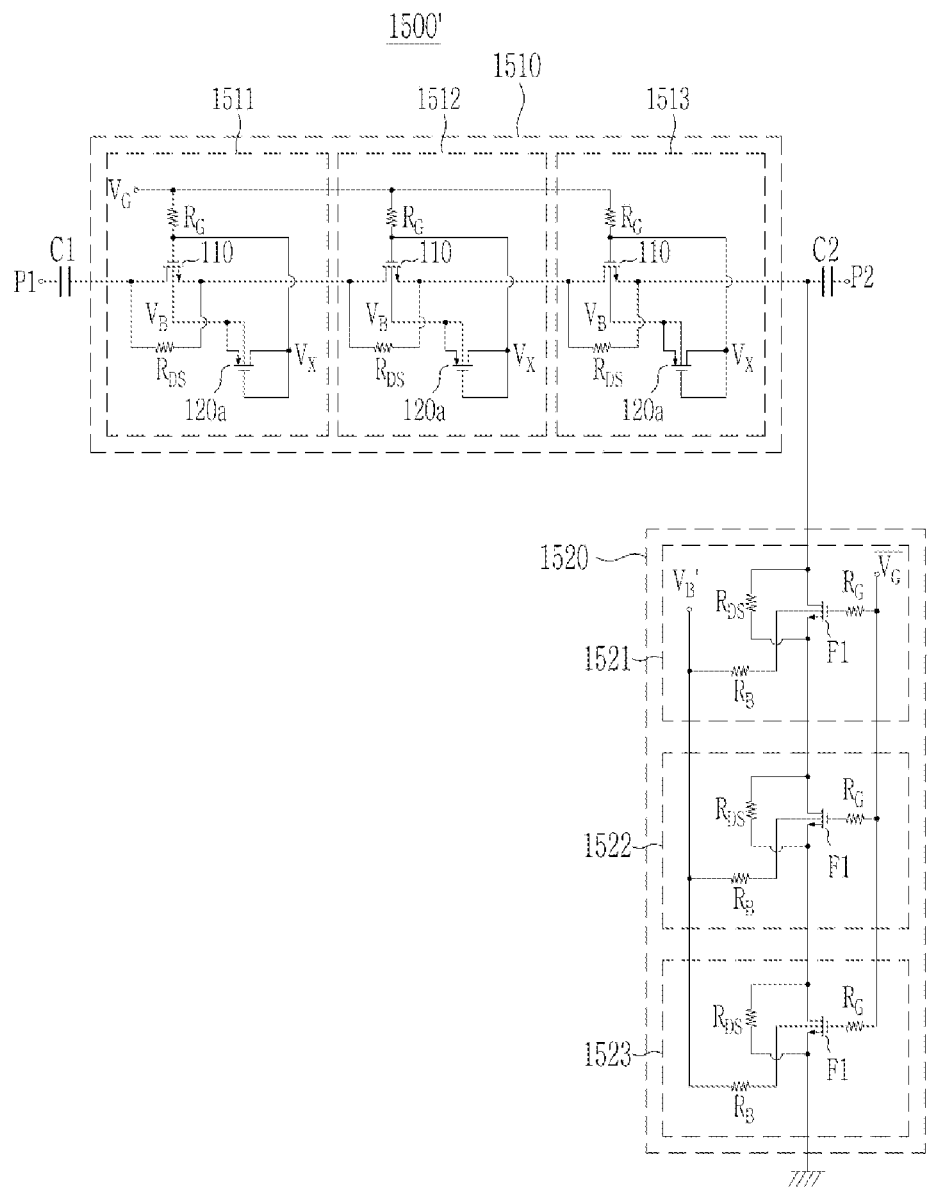
FIG. 17 shows an RF switch system according to another embodiment.

FIG. 17 shows an RF switch system 1500' according to another embodiment.

As shown in FIG. 17, the RF switch system 1500' may include a series switch 1510, a shunt switch 1520, a capacitor C1, and a capacitor C2. The RF switch system 1500' of FIG. 17 is similar to the RF switch system 1500 of FIG. 15 except that a capacitor C1 and a capacitor C2 are added to the RF switch system 1500 of FIG. 15.

The capacitor C1 may be connected between the first port P1 and the series switch 1510, and the capacitor C2 may be connected between a node between the series switch 1510 and the shunt switch 1520 and the second port P2. A DC voltage may be generated in the RF switch system 1500' of FIG. 17 because of the leakage current, and the capacitor C1 and the capacitor C2 may block the DC voltage.

According to one or more of the embodiments disclosed herein, the leakage current may be supplied to the switch transistor through the bias transistor so the insertion loss (IL) of the RF switch may be reduced.

According to one or more of the embodiments disclosed herein, the body voltage may be supplied to the body terminal of the switch transistor through the bias transistor, thereby reducing the number of the driving circuits.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) switch comprising:
a switch transistor; and
a bias transistor comprising a body terminal and a first terminal connected to each other in a diode-connected configuration, and configured to provide a first current to a body terminal of the switch transistor corresponding to a voltage applied to a control terminal of the switch transistor.

2. The RF switch of claim 1, further comprising
an impedance element connected between a first terminal of the switch transistor and a ground, and providing a path for the first current.

3. The RF switch of claim 2, wherein
the impedance element is a resistor.

4. The RF switch of claim 2, wherein
the impedance element includes at least one of a resistor, an inductor, and a diode.

5. The RF switch of claim 2, wherein
a path of the first current is formed in order of the control terminal of the switch transistor, the bias transistor, the body terminal of the switch transistor, the first terminal of the switch transistor, the impedance element, and the ground.

6. The RF switch of claim 1, wherein
the first terminal of the bias transistor is a source terminal.

7. The RF switch of claim 1, wherein
the bias transistor is a p-type transistor.

8. The RF switch of claim 7, wherein
the body terminal of the bias transistor is connected to the body terminal of the switch transistor, and
a second terminal and a control terminal of the bias transistor are connected to the control terminal of the switch transistor.

9. The RF switch of claim 1, wherein
the bias transistor is an n-type transistor.

10. The RF switch of claim 9, wherein
the body terminal of the bias transistor is connected to the control terminal of the switch transistor, and
a second terminal and a control terminal of the bias transistor are connected to the body terminal of the switch transistor.

11. The RF switch of claim 1, wherein
the switch transistor is connected between a first port and a second port,
the RF switch further includes an additional switch transistor connected between the second port and a ground and turned off when the switch transistor is turned on, and
a current path of the first current is formed by a resistor connected between a first terminal and a second terminal of the additional switch transistor.

12. A radio frequency (RF) switch comprising:
a switch transistor; and
a bias transistor comprising a body terminal connected to a body terminal of the switch transistor, a control terminal connected to a control terminal of the switch transistor, and configured to provide a first current to the body terminal of the switch transistor corresponding to a voltage applied to the control terminal of the switch transistor.

13. The RF switch of claim 12, wherein
the body terminal of the bias transistor is connected to a first terminal of the bias transistor, and
the control terminal of the bias transistor is connected to a second terminal of the bias transistor.

14. The RF switch of claim 13, wherein
the bias transistor is a p-type transistor.

15. The RF switch of claim 12, further comprising
an impedance element connected between a first terminal of the switch transistor and a ground, and providing a path for the first current.

16. The RF switch of claim 15, wherein
the impedance element includes at least one of a resistor, an inductor, and a diode.

17. The RF switch of claim 15, wherein
a path of the first current is formed in order of the control terminal of the switch transistor, the bias transistor, the body terminal of the switch transistor, the first terminal of the switch transistor, the impedance element, and the ground.

18. A radio frequency (RF) switch comprising:
a switch transistor; and
a bias transistor comprising a body terminal connected to a control terminal of the switch transistor, a control terminal connected to a body terminal of the switch transistor, and configured to provide a first current to the body terminal of the switch transistor corresponding to a voltage applied to the control terminal of the switch transistor.

19. The RF switch of claim 18, wherein
the body terminal of the bias transistor is connected to a first terminal of the bias transistor, and
the control terminal of the bias transistor is connected to a second terminal of the bias transistor.

20. The RF switch of claim 19, wherein
the bias transistor is an n-type transistor.

21. The RF switch of claim 18, further comprising
an impedance element connected between a first terminal of the switch transistor and a ground, and providing a path for the first current.

22. The RF switch of claim 21, wherein
the impedance element includes at least one of a resistor, an inductor, and a diode.

23. The RF switch of claim 21, wherein
a path of the first current is formed in order of the control terminal of the switch transistor, the bias transistor, the body terminal of the switch transistor, the first terminal of the switch transistor, the impedance element, and the ground.

24. A radio frequency (RF) switch comprising:
a switch transistor; and
a bias transistor configured to reduce a voltage between a body terminal and a first terminal of the switch transistor, and configured to provide a first current to the body terminal of the switch transistor corresponding to a voltage applied to a control terminal of the switch transistor,
wherein the bias transistor comprises a body terminal connected to the body terminal of the switch transistor, and a control terminal connected to the control terminal of the switch transistor.

25. The RF switch of claim 24, wherein the body terminal of the bias transistor and a first terminal of the bias transistor are connected to each other in a diode-connected configuration.

26. The RF switch of claim 24, further comprising
an impedance element connected between the first terminal of the switch transistor and a ground, and providing a path for the first current, wherein the impedance element includes at least one of a resistor, an inductor, and a diode.

27. A radio frequency (RF) switch comprising:
a switch transistor; and
a bias transistor configured to reduce a voltage between a body terminal and a first terminal of the switch transistor, and configured to provide a first current to the body terminal of the switch transistor corresponding to a voltage applied to a control terminal of the switch transistor,
wherein the bias transistor comprises a body terminal connected to the control terminal of the switch transistor, and a control terminal connected to the body terminal of the switch transistor.

* * * * *

UNITED STATES PATENT AND TRADEMARK OFFICE
CERTIFICATE OF CORRECTION

PATENT NO.       : 12,143,101 B2
APPLICATION NO.  : 18/181165
DATED            : November 12, 2024
INVENTOR(S)      : Byeonghak Jo et al.

Page 1 of 1

It is certified that error appears in the above-identified patent and that said Letters Patent is hereby corrected as shown below:

On the Title Page

Item (30), should read:
(30) Foreign Application Priority Data
Nov. 30, 2022 (KR)........10-2022-0164438
April 1, 2022 (KR)........10-2022-0040919

Signed and Sealed this
Eighteenth Day of February, 2025

Coke Morgan Stewart
*Acting Director of the United States Patent and Trademark Office*